US010211158B2

(12) United States Patent
Hohlfeld et al.

(10) Patent No.: US 10,211,158 B2
(45) Date of Patent: Feb. 19, 2019

(54) POWER SEMICONDUCTOR MODULE HAVING A DIRECT COPPER BONDED SUBSTRATE AND AN INTEGRATED PASSIVE COMPONENT, AND AN INTEGRATED POWER MODULE

(71) Applicant: Infineon Technologies AG, Neubiberg (DE)

(72) Inventors: Olaf Hohlfeld, Warstein (DE); Juergen Hoegerl, Regensburg (DE); Gottfried Beer, Nittendorf (DE); Magdalena Hoier, Seubersdorf (DE); Georg Meyer-Berg, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/529,371

(22) Filed: Oct. 31, 2014

(65) Prior Publication Data

US 2016/0126192 A1    May 5, 2016

(51) Int. Cl.
*H01L 23/538*    (2006.01)
*H01L 21/48*    (2006.01)
(Continued)

(52) U.S. Cl.
CPC ........ *H01L 23/5389* (2013.01); *H01L 21/486* (2013.01); *H01L 23/5384* (2013.01);
(Continued)

(58) Field of Classification Search
None
See application file for complete search history.

(56) References Cited

U.S. PATENT DOCUMENTS 6,882,538 B1    4/2005  Frisch
7,489,839 B2    2/2009  Kim et al.
(Continued)

FOREIGN PATENT DOCUMENTS

CN    1542968 A    11/2004
CN    102405524 A    4/2012
(Continued)

OTHER PUBLICATIONS

Infineon Technologies AG, "Recommendations for Printed Circuit Board Assembly of Infineon Laminate Packages", Additional Information, Infineon Technologies AG, 81726, Munich, Germany, Edition 2012-032, www.infineon.com, 1-16.
(Continued)

*Primary Examiner* — Robert Carpenter
(74) *Attorney, Agent, or Firm* — Murphy, Bilak & Homiller, PLLC

(57) ABSTRACT

A power semiconductor module includes a direct copper bonded (DCB) substrate having a ceramic substrate, a first copper metallization bonded to a first main surface of the ceramic substrate and a second copper metallization bonded to a second main surface of the ceramic substrate opposite the first main surface. The power semiconductor module further includes a power semiconductor die attached the first copper metallization, a passive component attached the first copper metallization, a first isolation layer encapsulating the power semiconductor die and the passive component, a first structured metallization layer on the first isolation layer, and a first plurality of electrically conductive vias extending through the first isolation layer from the first structured metallization layer to the power semiconductor die and the passive component. An integrated power module and a method of manufacturing the integrated power module are also provided.

13 Claims, 13 Drawing Sheets

(51) Int. Cl.
- *H01L 21/56* (2006.01)
- *H01L 23/00* (2006.01)
- *H01L 25/00* (2006.01)
- *H01L 23/31* (2006.01)
- *H01L 23/373* (2006.01)
- *H01L 23/498* (2006.01)

(52) U.S. Cl.
CPC ............. *H01L 24/00* (2013.01); *H01L 25/00* (2013.01); *H01L 21/561* (2013.01); *H01L 23/3135* (2013.01); *H01L 23/3735* (2013.01); *H01L 23/49811* (2013.01); *H01L 23/5386* (2013.01)

(56) References Cited

U.S. PATENT DOCUMENTS

| | | | |
|---|---|---|---|
| 8,030,131 | B2 | 10/2011 | Otremba et al. |
| 8,648,473 | B2 | 2/2014 | Prueckl |
| 8,658,904 | B2 | 2/2014 | Naganuma et al. |
| 9,320,137 | B2 | 4/2016 | Kim et al. |
| 2004/0121266 | A1 | 6/2004 | Lee et al. |
| 2005/0207133 | A1 | 9/2005 | Pavier et al. |
| 2005/0231889 | A1 | 10/2005 | Tsuji |
| 2006/0170098 | A1 | 8/2006 | Hsu |
| 2006/0249754 | A1 | 11/2006 | Forman et al. |
| 2008/0047737 | A1 | 2/2008 | Sahara et al. |
| 2008/0272829 | A1 | 11/2008 | Maeda |
| 2009/0031062 | A1 | 1/2009 | Shen et al. |
| 2009/0046437 | A1 | 2/2009 | Hsieh et al. |
| 2009/0115047 | A1* | 5/2009 | Haba .................. H01L 21/4857 257/690 |
| 2009/0296330 | A1 | 12/2009 | Ho et al. |
| 2010/0020515 | A1 | 1/2010 | Rubino et al. |
| 2010/0025087 | A1 | 2/2010 | Takahashi |
| 2011/0127675 | A1 | 6/2011 | Ewe et al. |
| 2012/0181706 | A1* | 7/2012 | Zeng .................. H01L 23/49524 257/777 |
| 2013/0220535 | A1 | 8/2013 | Lee et al. |
| 2013/0329374 | A1 | 12/2013 | Lin et al. |
| 2015/0255418 | A1 | 9/2015 | Gowda et al. |
| 2016/0079133 | A1* | 3/2016 | Nashida .................. H01L 24/01 257/690 |
| 2017/0077068 | A1* | 3/2017 | Horio .................. H01L 23/3735 |

FOREIGN PATENT DOCUMENTS

| | | |
|---|---|---|
| DE | 19924991 A1 | 12/2000 |
| DE | 10048379 A1 | 4/2001 |
| DE | 10214953 A1 | 10/2003 |
| DE | 10244365 A1 | 4/2004 |
| DE | 102005061016 A1 | 6/2007 |
| DE | 102006056363 A1 | 6/2008 |
| DE | 102007036045 A1 | 2/2009 |
| DE | 102008052029 A1 | 6/2009 |
| DE | 102009032995 A1 | 3/2010 |
| DE | 102011105346 A1 | 12/2012 |
| DE | 102011113255 A1 | 3/2013 |
| EP | 2538761 A1 | 12/2012 |
| JP | H06125180 A | 5/1994 |
| WO | 2009016039 A1 | 2/2009 |
| WO | 2012175207 A2 | 12/2012 |
| WO | 2013085992 A2 | 6/2013 |

OTHER PUBLICATIONS

Schweizer Electronic, "Products and Solutions", Schweizer Electronic AG, 78713 Schramberg, Germany, Oct. 2012, 1-12.

Schweizer Electronic, "Schweizer Inlay Board—the Secure and Reliable Inlay Technology", Schweizer Electronic AG, Oct. 2008, 1.

Schweizer Systems, "p2 Pack—the Power Embedding Solution", Increasing Packing Density and Thermal Performance with Minimized Parasitics for High Power Inverters, Schweiger Electronic AG, 78713 Schramberg, Germany, 1-6.

* cited by examiner

POWER SEMICONDUCTOR MODULE HAVING A DIRECT COPPER BONDED SUBSTRATE AND AN INTEGRATED PASSIVE COMPONENT, AND AN INTEGRATED POWER MODULE

TECHNICAL FIELD

The instant application relates to semiconductor modules, and more particularly to power semiconductor modules and integrated power modules.

BACKGROUND

Many applications such as automotive and industrial applications utilize power electronic circuitry such as IGBTs (insulated gate bipolar transistors), power MOSFETs (metal oxide semiconductor field effect transistors), power diodes, etc. For example, common power circuits include single and multi-phase half-wave rectifiers, single and multi-phase full-wave rectifiers, voltage regulators, etc. Integrated power modules (IPMs) include both power electronic circuitry and the logic circuitry for controlling operation of the power electronic circuitry. In some conventional IPMs, the power dies (chips) are attached to a power electronic substrate such as a DBC (direct bonded copper), IMS (insulated metal substrate) or AMB (active metal brazed) substrate. The logic dies are surface mounted to a separate logic printed circuit board. The power electronic substrate is then connected to the logic printed circuit board by a rigid connector. In other conventional IPMs, the connection mechanism is not as bulky. However, the power dies are typically surface mounted to a second printed circuit board. In both IPM implementations, significant area is needed to accommodate the various parts, increasing the overall size and cost of the IPM. Other conventional IPMs inlay a power semiconductor module within the logic printed circuit board. While this approach reduces the area needed to implement the IPM, it has significantly more process steps and is costly. As such, a smaller, simpler, and more cost-effective IPM solution is needed.

SUMMARY

According to an embodiment of an integrated power module, the integrated power module comprises a power semiconductor module that comprises a first power semiconductor die attached to a metallized side of an insulating substrate, a first isolation layer encapsulating the first power semiconductor die, and a first structured metallization layer on the first isolation layer and electrically connected to the first power semiconductor die by at least a first plurality of electrically conductive vias that extend through the first isolation layer. The integrated power module further comprises a second isolation layer on the power semiconductor module, a second plurality of electrically conductive vias extending through the second isolation layer to the first structured metallization layer, and a first logic or passive semiconductor die encapsulated in the second isolation layer or in an isolation layer above the second isolation layer. The first logic or passive semiconductor die is electrically connected to the first power semiconductor die by at least the first metallization layer and the first plurality of electrically conductive vias, or to another semiconductor die disposed within the integrated power module.

According to an embodiment of a power semiconductor module, the power semiconductor module comprises a direct copper bonded (DCB) substrate comprising a ceramic substrate, a first copper metallization bonded to a first main surface of the ceramic substrate and a second copper metallization bonded to a second main surface of the ceramic substrate opposite the first main surface. The semiconductor module further comprises a power semiconductor die attached the first copper metallization, a passive component attached the first copper metallization, a first isolation layer encapsulating the power semiconductor die and the passive component, a first structured metallization layer on the first isolation layer, and a first plurality of electrically conductive vias extending through the first isolation layer from the first structured metallization layer to the power semiconductor die and the passive component.

According to an embodiment of a method of manufacturing an integrated power module, the method comprises: providing a power semiconductor module that comprises a first power semiconductor die attached to a metallized side of an insulating substrate, a first isolation layer encapsulating the first power semiconductor die, and a first structured metallization layer on the first isolation layer and electrically connected to the first power semiconductor die by at least a first plurality of electrically conductive vias that extend through the first isolation layer; forming a second isolation layer on the power semiconductor module; forming a plurality of openings in the second isolation layer; filling the plurality of openings with a second plurality of electrically conductive vias; and encapsulating a first logic or passive semiconductor die in the second isolation layer or an isolation layer above the second isolation layer, the first logic or passive semiconductor die being electrically connected to the first power semiconductor die by at least the first structured metallization layer and the first plurality of electrically conductive vias, or to another semiconductor die disposed within the integrated power module.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 2, which includes

DETAILED DESCRIPTION

According to embodiments described herein, an integrated power module includes a power semiconductor module and an embedded laminate structure attached to the power semiconductor module. The embedded laminate structure includes logic and/or passive semiconductor dies that form part of a power electronic circuit. The power semiconductor dies of the power electronic circuit are embedded in the power semiconductor module. Also described herein is an embodiment of the power semiconductor module in which the power semiconductor module includes a direct copper bonded (DCB) substrate, at least one power semiconductor die such as an IGBT (insulated gate bipolar transistor) or a power MOSFET (metal oxide semiconductor field effect transistor) attached a metallized side of the DCB substrate, and at least one passive component of the power electronic circuit integrated within the power semiconductor module.

Figure 1A:
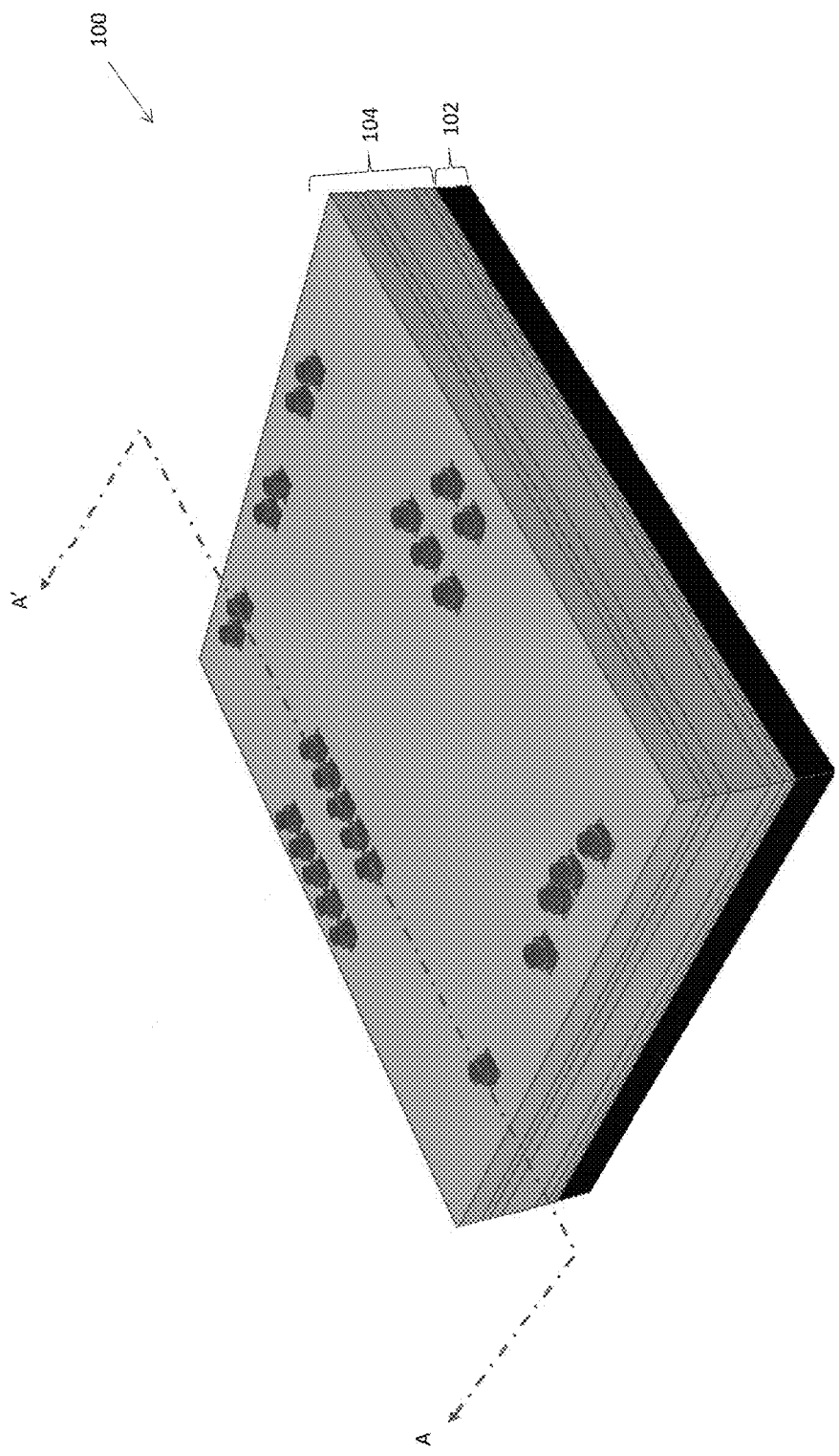
FIG. 1, which includes FIG. 1A (perspective view) and FIG. 1B (sectional view), illustrates an embodiment of an integrated power module that includes a power semiconductor module and an embedded laminate structure attached to the power semiconductor module.
Figure 1B:
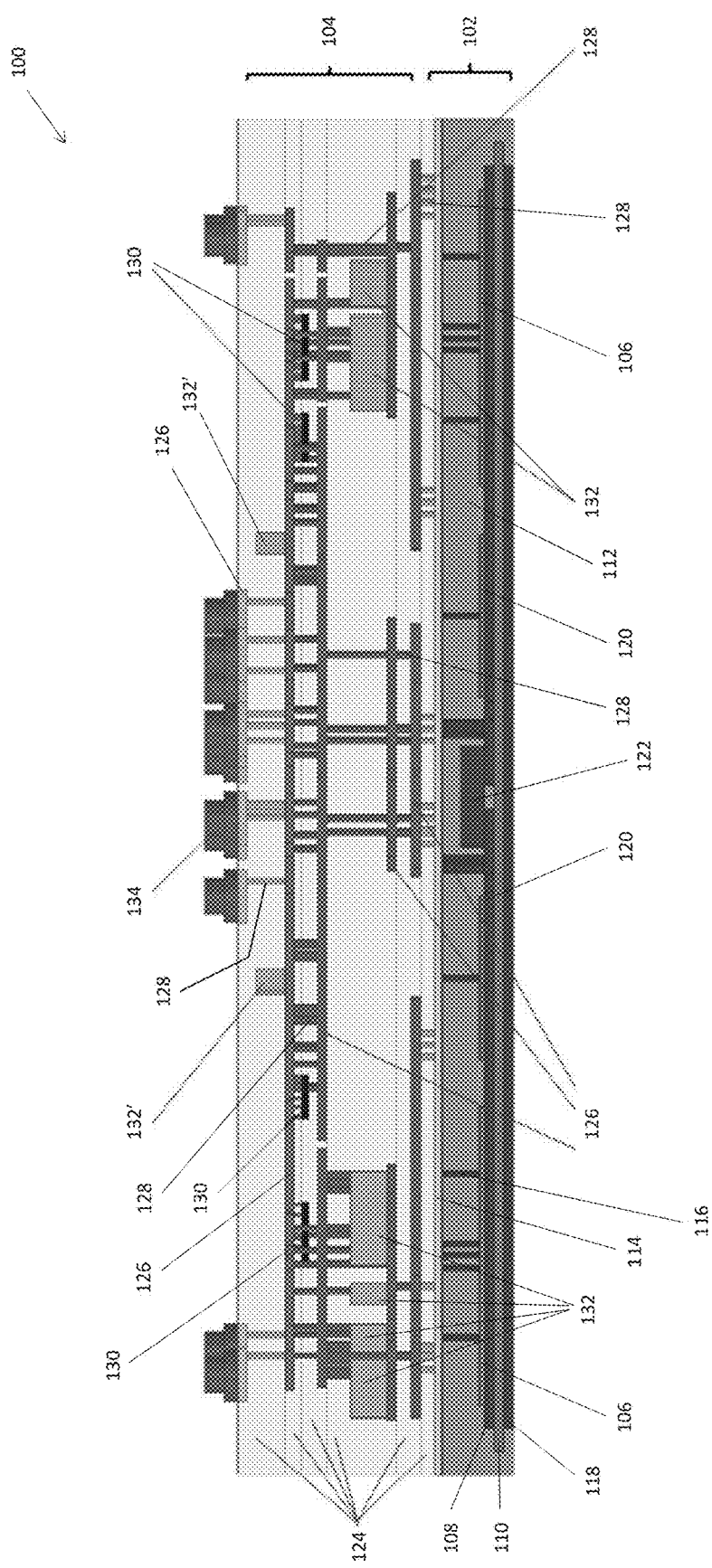

FIG. 1, which includes FIGS. 1A and 1B, illustrates an embodiment of an integrated power module 100. FIG. 1A shows a perspective view of the integrated power module 100, and FIG. 1B shows a sectional view of the integrated power module 100 along the line labelled A-A' in FIG. 1A.

The integrated power module 100 includes a power semiconductor module 102 and an embedded laminate structure 104 attached to the power semiconductor module 102. The power semiconductor module 102 comprises at least one power semiconductor die 106 attached to a metallized side 108 of an insulating substrate 110, an isolation layer 112 encapsulating the power semiconductor die(s) 106, and a structured metallization layer 114 on the isolation layer 112 and electrically connected to the power semiconductor die(s) 106 by at least electrically conductive vias 116 that extend through the isolation layer 112.

One or both of the main sides of the insulating substrate 110 can be metallized. The metallized first side 108 of the insulating substrate 110 can comprise the same or different material than the metallized second side 118 of the insulating substrate 110. For example, the insulating substrate 110 can be a standard DCB (direct copper bonded), DAB (direct aluminum bonded), AMB (active metal brazed) or IMS (insulated metal substrate) substrate. A standard DCB substrate includes copper surfaces applied to the top and bottom areas of an isolation material such as an $Al_2O_3$ ceramic material. A standard DAB substrate includes aluminum surfaces applied to the top and bottom areas of a ceramic material. A standard AMB substrate includes metal foils brazed to opposing sides of an isolation material such as an AlN ceramic material. A standard IMS substrate includes an isolation material such as a polymer directly connected to a module base plate.

In general, the power semiconductor module 102 includes the power semiconductor dies 106 that form the power components of a power electronic circuit such as a half-bridge or full-bridge circuit. For example in the case of IGBT dies, corresponding freewheeling diode dies 120 are also attached to a metallized side 108 of the insulating substrate 110. One or more passive components 122 such as one or more passive semiconductor dies, a negative temperature coefficient (NTC) thermistor, etc. that also form part of the power electronic circuit can be attached to one of the metallized sides 108/118 of the insulating substrate 110 and the opposing side 118/108 is used for heat spreading. Alternatively, these passive component(s) 122 can be disposed in the embedded laminate structure 104 of the integrated power module 100 and/or attached to an exterior side of the embedded laminate structure 104. In each case, the lowermost isolation layer 112 of the power semiconductor module 102 can be molded or laminated onto the insulating substrate 110, and the power semiconductor module 102 can include more than one isolation and metallization layers 112, 114.

The embedded laminate structure 104 of the integrated power module 100 can be implemented as a single- or multi-layer circuit board structure attached to the power semiconductor module 102 in a material-locking and form-fitting manner. The circuit board structure can be formed as a thick-copper printed circuit board, to substantially improve heat dissipation.

The embedded laminate structure 104 includes at least on isolation layer 124 on the power semiconductor module 102 and a structured metallization layer 126 on each isolation layer 124 of the embedded laminate structure 104. Each isolation layer 124 of the embedded laminate structure 104 can be formed by lamination. Each isolation layer 124 of the embedded laminate structure 104 can include a substantially planar prefabricated board including a material such as glassfibre reinforced matrix, or other material, which is typically used to fabricate circuit boards. For example, each isolation layer 124 of the embedded laminate structure 104 can include a glass fibre reinforced epoxy resin, such as FR4. Each isolation layer 124 of the embedded laminate structure 104 can include PTFE (Polytetrafluoroethylene), PEN (Polyethylene Naphthalate), PET (Polyethylene Terephthalate, BT laminate (Bismaleimide-Triazine) or Polyimide, for example.

Different ones of the structured metallization layers 126 of the embedded laminate structure 104 are electrically connected to one another by conductive vias 128 that extend through the isolation layer(s) 124 that separate those structured metallization layers 126. The embedded laminate structure 104 also includes one or more logic and/or passive semiconductor dies 130, 132 encapsulated in one or more isolation layers 124 of the embedded laminate structure 104. Each logic/passive semiconductor die 130/132 is electrically connected to a power semiconductor die 106/120 in the power semiconductor module 102 by at least the structured metallization layer(s) 114 and electrically conductive vias 116 of the power semiconductor module 102 and one or more structured metallization layers 126 and electrically conductive vias 128 of the embedded laminate structure 104, or to another semiconductor die 130/132 disposed within the integrated power module 100.

For example in FIG. 1B, a plurality of passive semiconductor dies 132 are attached to a second structured metallization layer 126 of the embedded laminate structure 104. These passive semiconductor dies 132 are electrically connected to a power semiconductor die 106/120 in the power semiconductor module 102 by the second structured metallization layer 126 of the embedded laminate structure 104, the first structured metallization layer 126 of the embedded laminate structure 104 under the second structured metallization layer 126, and the electrically conductive vias 128 that extend between the first and second structured metallization layers 126. The electrical pathway between these passive semiconductor dies 132 and a power semiconductor die 106/120 in the power semiconductor module 102 is completed by the structured metallization layer(s) 114 and electrically conductive vias 116 of the power semiconductor module 102. The term 'passive semiconductor die' as used herein refers to a semiconductor die that contains one or more passive components such as capacitor(s), resistor(s) or inductor(s) and is devoid of active devices such as transistors.

Also in FIG. 1B, a plurality of logic semiconductor dies 130 are attached to a fourth structured metallization layer 126 of the embedded laminate structure 104. The logic semiconductor dies 130 control switching of the power semiconductor dies 106 included in the power semiconductor module 102. For example, the logic semiconductor dies 130 can include driver circuitry, a controller, a processor, or any other type of logic device used to control the operation of the power electronic circuit included in the integrated power module 100. The logic semiconductor dies 130 are electrically connected to a power semiconductor die 106 in the power semiconductor module 102 by the fourth structured metallization layer 126 of the embedded laminate structure 104, the structured metallization layers 126 of the embedded laminate structure 104 under the fourth structured metallization layer 126, and the electrically conductive vias 128 that extend between these structured metallization layers 126. The electrical pathway between the logic semiconductor dies 130 and a power semiconductor die 106 in the power semiconductor module 102 is completed by the structured metallization layer(s) 114 and electrically conductive vias 116 of the power semiconductor module 102.

FIG. 1B also shows additional passive semiconductor dies 132' attached to a structured metallization layer 126 of the embedded laminate structure 104 above the structured metallization layer 126 to which the logic semiconductor dies 130 are attached. For example, in the case a half-bridge or full-bridge circuit, a first power semiconductor die 106 in the power semiconductor module 102 is a high-side power transistor die of the half-bridge or full-bridge circuit and a second power semiconductor die 106 in the power semiconductor module 102 is a low-side power transistor die of the half-bridge or fill-bridge circuit. In this example, the passive semiconductor dies 132 encapsulated in a lower isolation layer 124 of the embedded laminate structure 104 are high-side passive components such as high-side capacitors of the half-bridge or full-bridge circuit and are electrically connected to the high-side power transistor. Further according to this example, the additional passive semiconductor dies 132' encapsulated in an upper isolation layer 124 of the embedded laminate structure 104 are low-side passive components such as low-side capacitors of the half-bridge or full-bridge circuit and are electrically connected to the low-side power transistor. According to this embodiment, the high-side passive component dies 132 are spaced closer to the power semiconductor module 102 than the low-side passive component dies 132'. That is, the low-side passive components 132' of the power electronic circuit are disposed in an isolation layer 124 of the embedded laminate structure 104 between the uppermost isolation layer 124 and the isolation layer 124 in which the high-side passive components 132 are disposed.

With such a design for the integrated power module, the integrated power module is provided with a complete driver circuit integrated in a material-locking and form-fitting manner with a power semiconductor module 102 that includes the power devices 106, 120 controlled by the driver circuit. The driver circuit can be provided e.g. using a single- or multi-layer printed circuit board (PCB) technology. The driver circuit is composed of a driver die or driver chip set e.g. one or more dies 130, each driver die controlling the switching of one of the power semiconductor dies included in the power semiconductor module, and the associated passive components such as resistors, capacitors, etc. embedded on or in the PCB structure.

The integrated power module 100 further includes external electrical contacts 134 such as press-fit bush connectors, solder depots, contact pins, etc. disposed on the uppermost isolation layer 124 of the embedded laminate structure 104. The external electrical contacts 134 provide a point of external electrical connection to the internal electrical components 106, 120, 130, 132, 132' included in the integrated power module 100. The external contact elements 134 are connected by electrically conductive vias 128 extending through the isolation layers 124 of the embedded laminate structure 104, and are electrically connected to the semiconductor dies 106, 130 included in the power semiconductor module 102 and the embedded laminate structure 104 of the integrated power module 100.

The integrated power module 100 has a reduced footprint and volume, optimizes electrical performance by providing short and thus low-ohmic and low parasitic connection paths, and has a scalable external interconnect e.g. with contact elements 134 arranged in array form to provide an ultra-dense contact area.

FIG. 2, which includes FIGS. 2A through 2G, illustrates an embodiment of manufacturing an integrated power module of the kind shown in FIG. 1. The method includes providing a power semiconductor module, which is illustrated in more detail in FIGS. 2A through 2D.

Figure 2A:
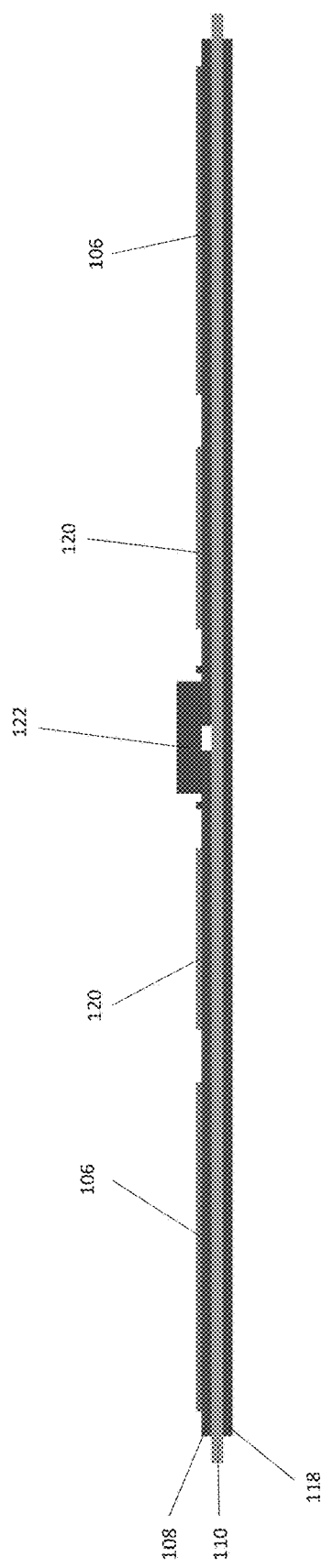
FIG. 2A through 2G, illustrates an embodiment of a method of manufacturing an integrated power module that includes a power semiconductor module and an embedded laminate structure attached to the power semiconductor module.

In FIG. 2A, power semiconductor dies 106, 120 are attached to the top metallized side 108 of an insulating substrate 110 such as a DCB substrate. One or more passive components 122 such as one or more passive semiconductor dies, a negative temperature coefficient (NTC) thermistor, etc. that form part of the same power electronic circuit as the power semiconductor dies 106, 120 can also be attached to one of the metallized sides 108/118 of the insulating substrate 110.

Figure 2B:
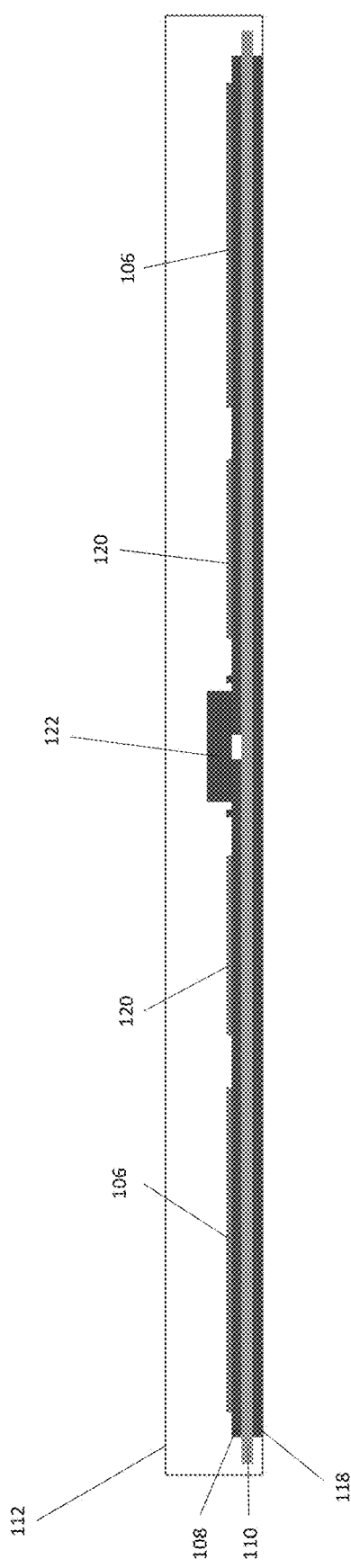

In FIG. 2B, the power semiconductor dies 106, 120 and any passive components 122 attached to a metallized side 108/118 of the insulating substrate 110 are encapsulated in an isolation layer 112 e.g. by molding or lamination.

Figure 2C:
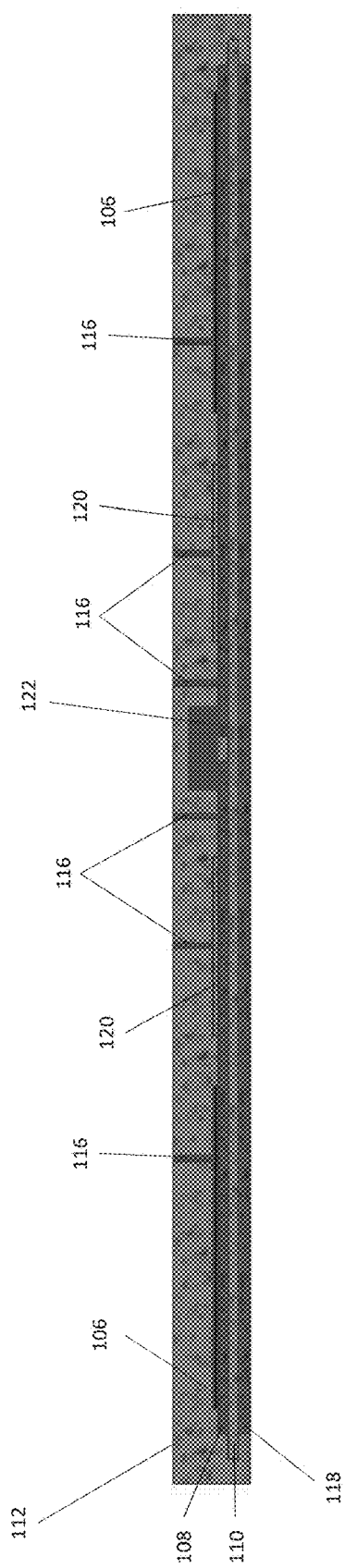

In FIG. 2C, openings are formed in the isolation layer 112 e.g. by laser drilling and the openings are filled with an electrically conductive material to form electrically conductive vias 116 in contact with the power semiconductor dies 106, 120 and any passive components 122 attached to a metallized side 108/118 of the insulating substrate 110.

Figure 2D:
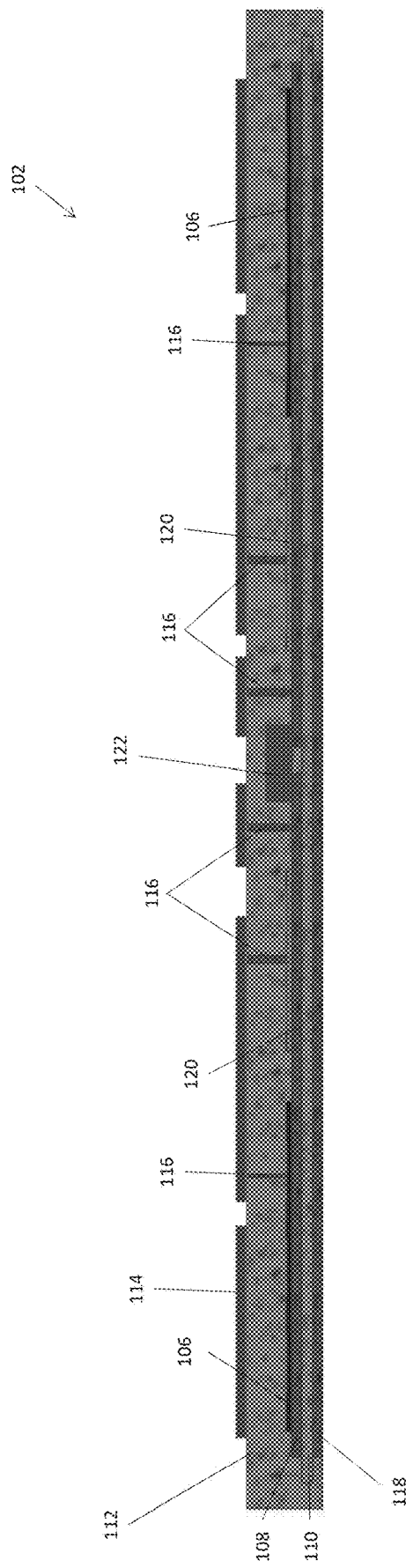

In FIG. 2D, a structured metallization layer 114 such as a structured copper layer is formed on the isolation layer 112 using any standard metallization and structuring processes. In the case of copper, the structured metallization layer 114 can be a structured plate or formed by electroless plating or electroplating of copper on a seed layer disposed on the underlying isolation layer 112 and structuring the copper. The electrically conductive vias 116 connect the structured metallization layer 114 to the power semiconductor dies 106, 120. One or more additional isolation and metallization layers can be included in the power semiconductor module 102 by repeating the processes illustrated in FIGS. 2B through 2D.

Figure 2E:
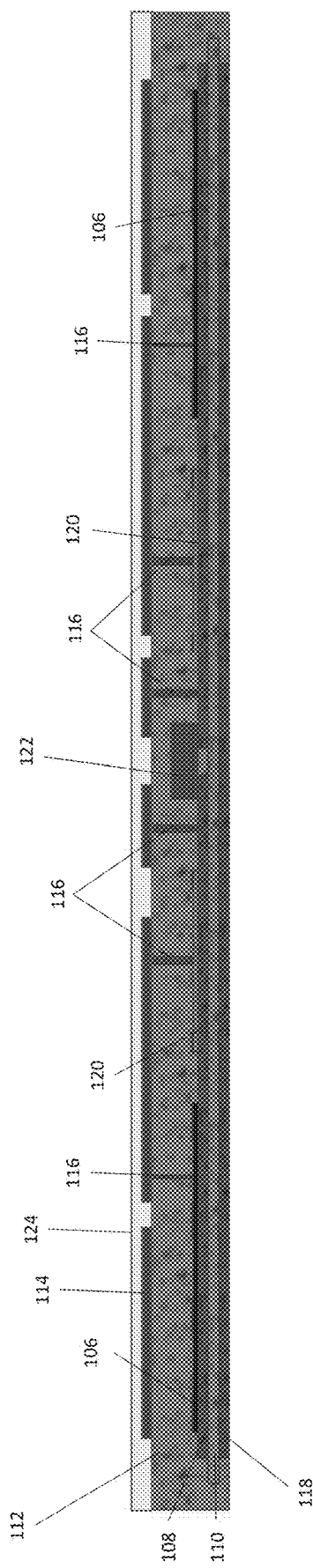
Figure 2F:
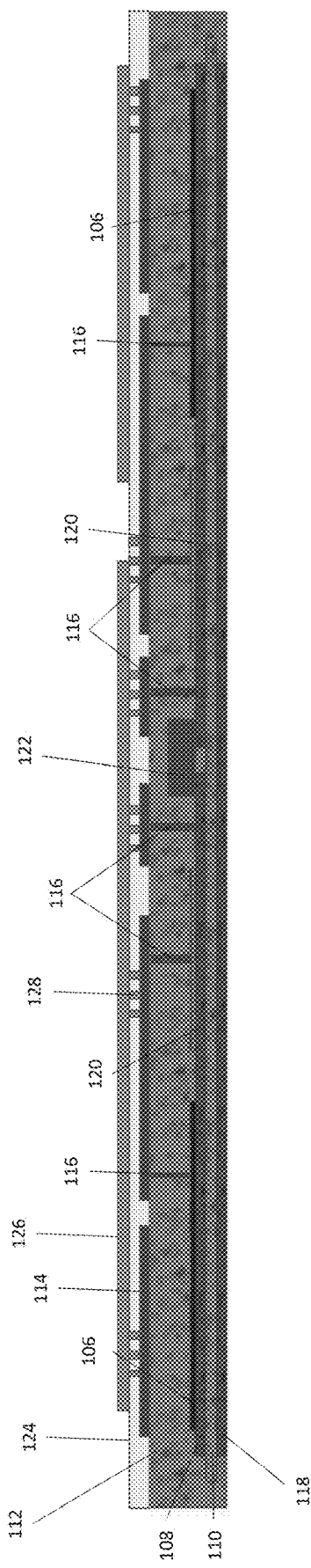
Figure 2G:
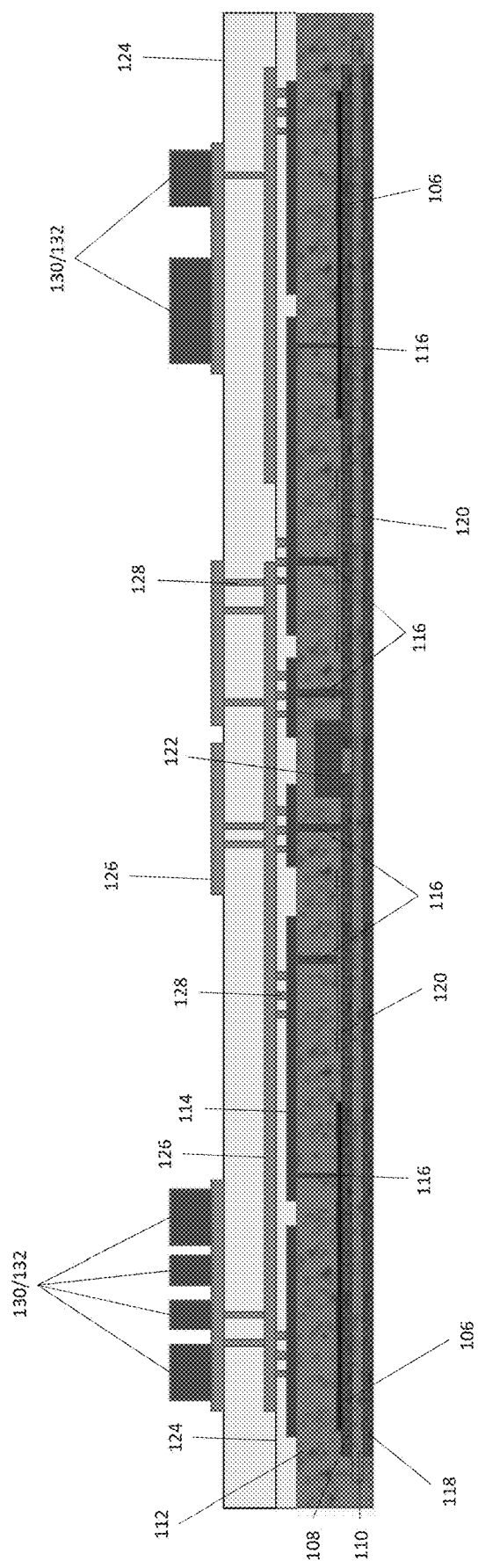

The embedded laminate structure 104 of the integrated power module 100 is then formed on the power semiconductor module 102, which is illustrated in more detail in FIGS. 2E through 2G.

In FIG. 2E, an isolation layer 124 is formed on the power semiconductor module 102 e.g. by molding or lamination.

In FIG. 2F, openings are formed in the lowermost isolation layer 124 of the embedded laminate structure 104, the openings are filled with an electrically conductive material to form electrically conductive vias 128, and a structured metallization layer 126 such as a structured copper layer is formed on the lowermost isolation layer 124 of the embedded laminate structure 104 using any standard metallization and structuring processes. In the case of copper, the structured metallization layer 126 can be formed by electroless plating or electroplating of copper on a seed layer disposed on the underlying isolation layer 124 and structuring the copper. In each case, the electrically conductive vias 128 connect the lowermost structured metallization layer 126 of the embedded laminate structure 104 to the uppermost structured metallization layer 114 of the power semiconductor module 102.

In FIG. 2G, the laminating/molding, via formation and filling, metallization and metallization structuring processes illustrated in FIGS. 2E and 2F are repeated to form an additional isolation layer 124 on the lowermost structured metallization layer 126 of the embedded laminate structure 104, an additional structured metallization layer 126 on this new isolation layer 124 and electrically conductive vias 128 connecting the two vertically adjacent structured metallization layers 126 of the embedded laminate structure 104. Also, one or more logic and/or passive semiconductor dies 132 are attached to the new structured metallization layer 126 e.g. using any standard surface mount or other die attach technology.

The laminating/molding, via formation and filling, metallization and metallization structuring, and the die attach process illustrated in FIGS. 2E through 2G are repeated as many times as needed to yield the desired number of structured metallization layers 126 within the embedded laminate structure 104 and to embed the logic and/or passive dies 130, 132 of the power electronic circuit within the embedded laminate structure 104. In one embodiment, each of the isolation layers 124 of the embedded laminate structure 104 is a laminate. More generally, each of the isolation layers 112, 124 of the power semiconductor module 102 and of the embedded laminate structure 104 can comprise one or more of a polymer material, a mold material, a resin material, an epoxy resin material, an acrylate material, polyimide material, and a silicone-based material.

External electrical contacts 134 are then provided on the uppermost isolation layer 124 of the embedded laminate structure 104, yielding the integrated power module 100 shown in FIG. 1. The vias and structured metallization layers 116, 128, 114, 124 of both the power semiconductor module 102 and the embedded laminate structure 102 provide the electrical connections between the power semiconductor dies 106, 120 included in the power semiconductor module 102 and the logic and/or passive dies 130, 132 included in the embedded laminate structure 102 necessary to complete the desired power electronic circuit.

Figure 3:
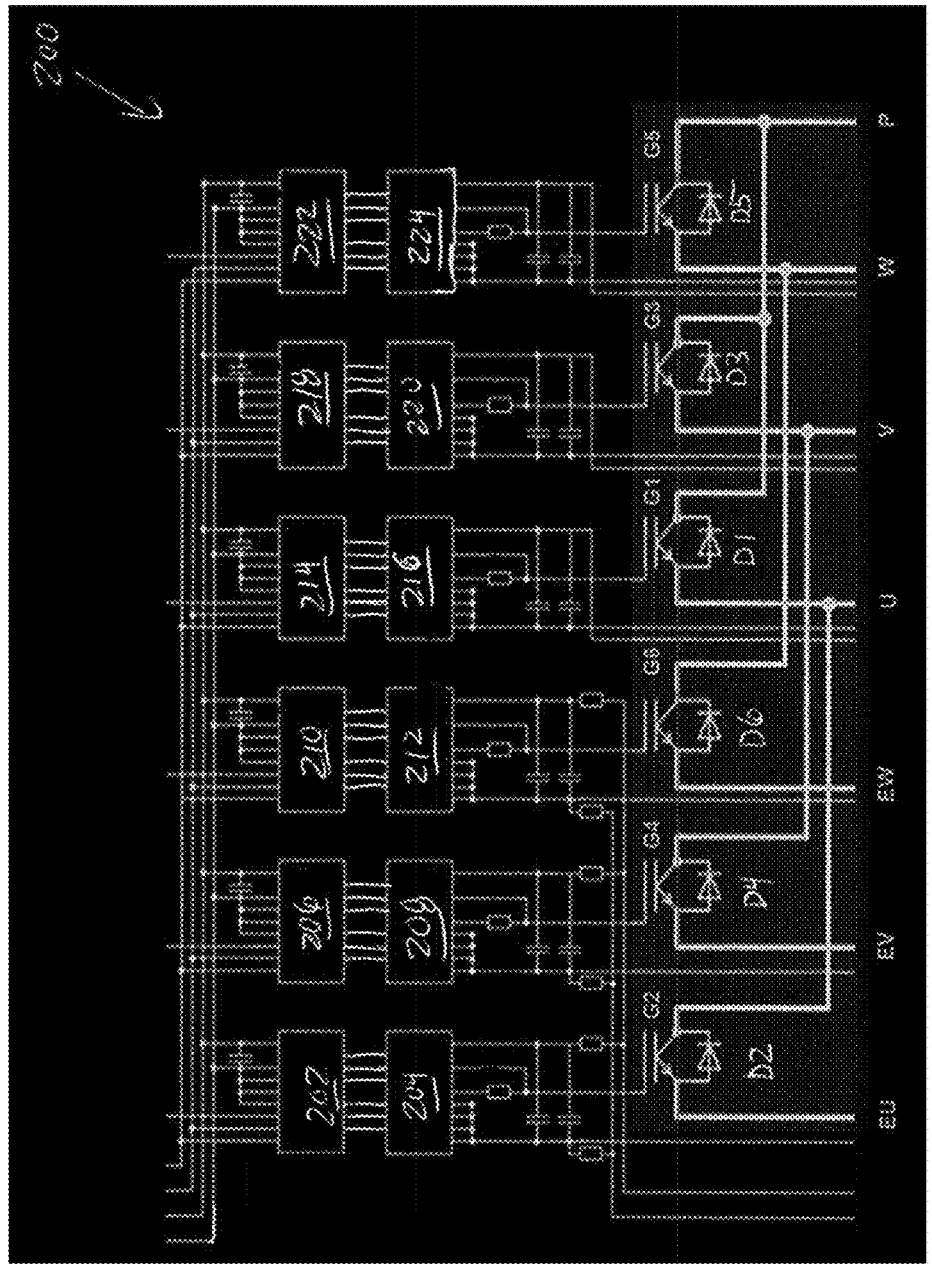
FIG. 3 illustrates an exemplary schematic of a power electronic circuit contained in an integrated power module that includes a power semiconductor module and an embedded laminate structure attached to the power semiconductor module.

A circuit schematic of an exemplary power electronic circuit 200 such as a half-bridge or full-bridge circuit is shown in FIG. 3. In the example shown in FIG. 3, the power electronic circuit includes six power transistors G1 through G6, a freewheeling diode D1 through D6 connected to each power transistor, and drivers 202-224 for controlling switching of the power transistors. The freewheeling diodes can be integrated with the respective power transistor in the same die e.g. in the case of power MOSFETs, or provided as separate dies e.g. in the case of IGBTs. The power electronic circuit 200 also includes various passive components such as capacitors, resistors, etc. which are schematically shown in FIG. 3. The power transistors are contained in power semiconductor dies encapsulated in the power semiconductor module 102 of the integrated power module 100 as previously described herein, and the drivers are contained in logic semiconductor dies 130 encapsulated in the embedded laminate structure 104 of the integrated power module 100 also as previously described herein. One or more of the passive components can be contained in passive semiconductor components 120, 132 encapsulated in the power semiconductor module 102 and/or the embedded laminate structure 104 as passive semiconductor dies. Still other ones of the passive components can be attached to an exterior side of the embedded laminate structure 104. For example in the case of a six-pack IGBT power module, the rectifiers and choppers can be integrated within the embedded laminate structure 104. The choppers can be driven by a separate drive of the embedded laminate structure.

The single- or multi-layer embedded laminate structure 104 of the integrated power module 100 acts as an integration and connection element for the signal routing of the drivers to the power transistors, the connection to other of embedded laminate structures, the distribution and separation of the potential domains (U, V, W, EU, EV, EW, P), and the provision for connection of the potential domains to the external electrical contacts 134 of the integrated power module 100.

Figure 4:
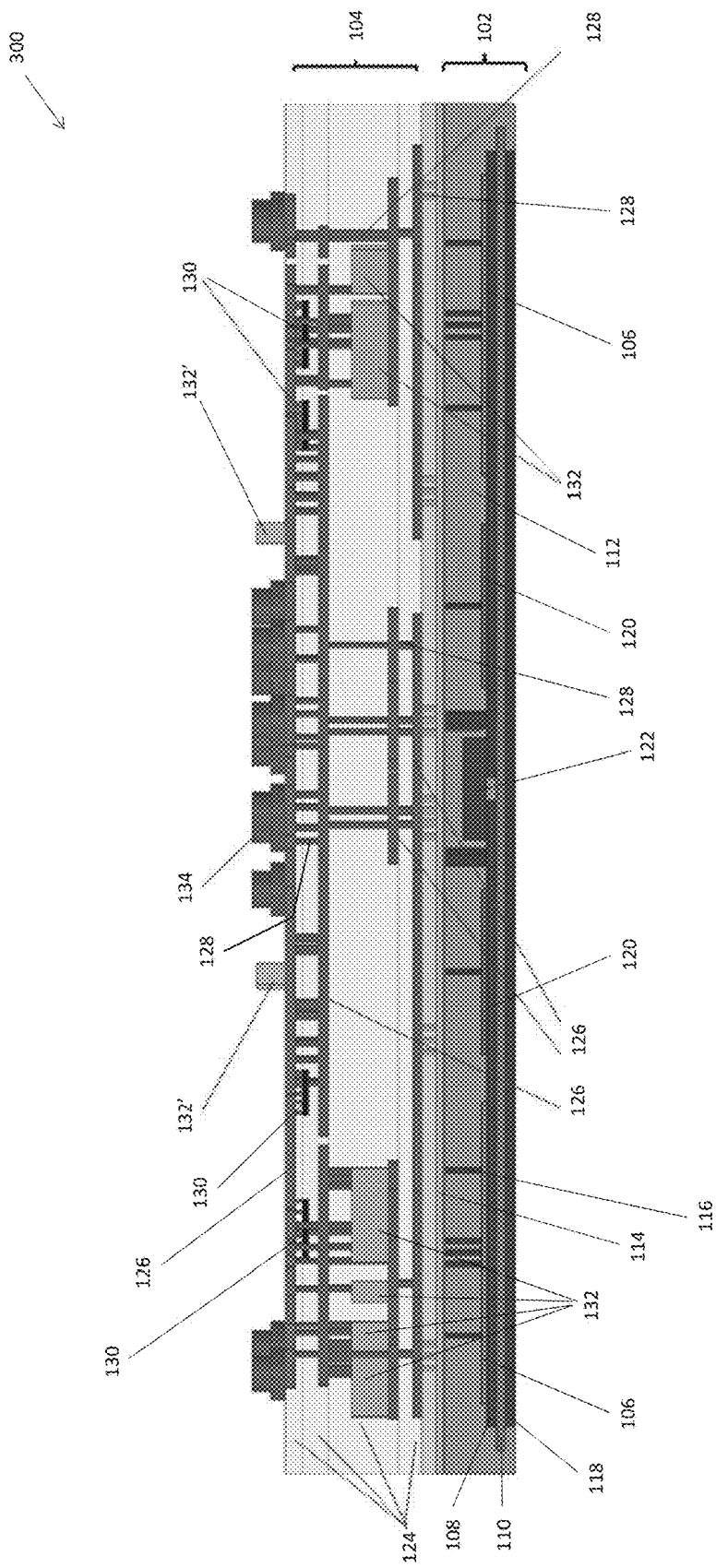
FIG. 4 illustrates a sectional view of another embodiment of an integrated power module that includes a power semiconductor module and an embedded laminate structure attached to the power semiconductor module.

FIG. 4 illustrates another embodiment of an integrated power module 300 that includes a power semiconductor module 102 and an embedded laminate structure 104 attached to the power semiconductor module 102. The embodiment of the integrated power module 300 shown in FIG. 4 is similar to the embodiment shown in FIG. 1, however, at least some of the passive semiconductor dies 132' e.g. the low-side passive components of the power electronic circuit are disposed on the uppermost isolation layer 124 of the embedded laminate structure 104 instead of being encapsulated in one of the isolation layers 124 of the embedded laminate structure 104. For example, these low-side passive components 132' can be attached to the same side of the embedded laminate structure 104 as the external contacts 134 of the integrated power module 300.

Figure 5:
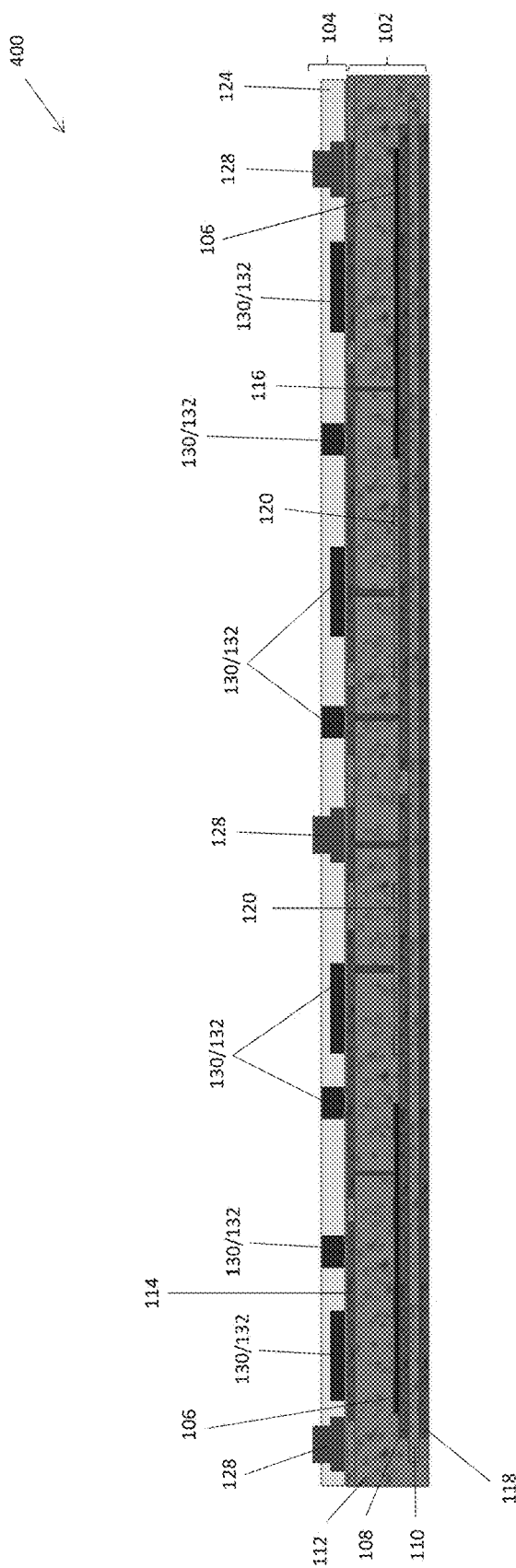
FIG. 5 illustrates a sectional view of yet another embodiment of an integrated power module that includes a power semiconductor module and an embedded isolation structure attached to the power semiconductor module.

FIG. 5 illustrates yet another embodiment of an integrated power module 400 that includes a power semiconductor module 102 and an embedded isolation structure 104 attached to the power semiconductor module 102. According to this embodiment, only a single isolation layer 124 is disposed e.g. by lamination on the power semiconductor module 102. The logic and/or passive components 130/132 of the power electronic circuit are encapsulated in the single isolation layer 124. Also according to this embodiment, the conductive vias 128 that extend through the single isolation layer 124 of the embedded laminate structure 104 to the uppermost metallization layer 114 of the power semiconductor module 102 form the external electrical contacts of the integrated power module 400. These conductive vias 128 can be in the form of pins, press-fit connectors, or any other standard electrical connector suitable to act as external electrical contacts for the integrated power module 400.

Figure 6:
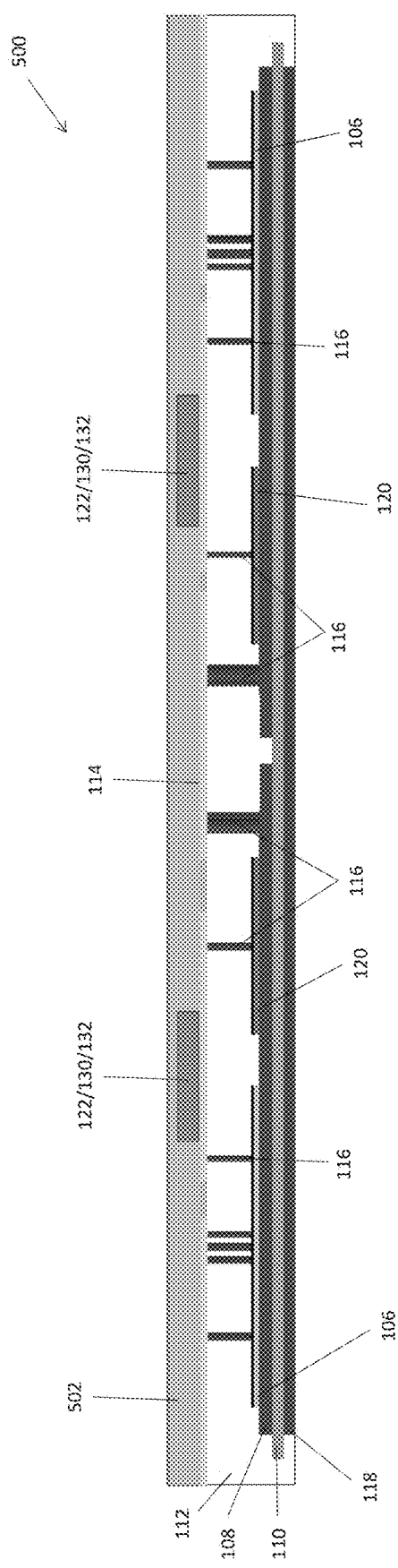
FIG. 6 illustrates a sectional view of an embodiment of a power semiconductor module included in an integrated power module that also includes an embedded laminate structure.

FIG. 6 illustrates another embodiment of a power semiconductor module 500 included in the integrated power modules 100, 300 described herein. The embodiment of the power semiconductor module 500 shown in FIG. 6 is similar to the embodiment shown in FIG. 2D, however, at least some logic and/or passive components 122/130/132 of the power electronic circuit are disposed in an encapsulant 502 such as a silicone gel disposed on the uppermost structured metallization layer 114 of the power semiconductor module 500. For example, these low-side passive components 122/132 can be directly attached to the uppermost structured metallization layer 114 of the power semiconductor module 500. The uppermost structured metallization layer 114 and the electrically conductive vias 116 of the power semiconductor module 500 provide electrical connections between the logic and/or passive components 122/130/132 disposed in the encapsulant 502 and the underlying power semiconductor dies 106, 120. The encapsulant 502 can be applied directly to the power semiconductor module 500, particularly if the passive components 122/132 are relatively thin (e.g. <0.3 mm).

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An integrated power module, comprising:
a power semiconductor module, comprising:
a first power semiconductor die attached to a metallized side of an insulating substrate;
a first isolation layer encapsulating the first power semiconductor die; and
a first structured metallization layer on the first isolation layer and electrically connected to the first power semiconductor die by at least a first plurality of electrically conductive vias that extend through the first isolation layer;
a second isolation layer on the power semiconductor module;
a second plurality of electrically conductive vias extending through the second isolation layer to the first structured metallization layer; and
a first logic or passive semiconductor die encapsulated in the second isolation layer or in an isolation layer above the second isolation layer, the first logic or passive semiconductor die being electrically connected to the first power semiconductor die by at least the first structured metallization layer and the first plurality of electrically conductive vias, or to another semiconductor die disposed within the integrated power module,
wherein the insulating substrate and the first isolation layer are the only bottom-most components of the semiconductor module.

2. The integrated power module of claim 1, further comprising a second structured metallization layer on the second isolation layer, wherein the second plurality of electrically conductive vias extend through the second isolation layer from the second structured metallization layer to the first structured metallization layer, and wherein the first logic or passive semiconductor die is electrically connected to the first power semiconductor die by at least the first and second structured metallization layers and the first and second plurality of electrically conductive vias, or to another semiconductor die disposed within the integrated power module.

3. The integrated power module of claim 2, further comprising:
a plurality of additional isolation layers interposed between the second structured metallization layer and an uppermost isolation layer of the integrated power module;
an additional structured metallization layer interposed between adjacent ones of the additional isolation layers; and
additional electrically conductive vias extending through the additional isolation layers between adjacent ones of the additional structured metallization layers.

4. The integrated power module of claim 1, further comprising external electrical contacts disposed on an uppermost isolation layer that is above the first logic or passive semiconductor die.

5. The integrated power module of claim 1, wherein the first logic or passive semiconductor die is a first driver semiconductor die operable to control switching of the first power semiconductor die.

6. The integrated power module of claim 1, wherein the power semiconductor module further comprises a second power semiconductor die attached to the metallized side of the insulating substrate, and wherein the integrated power module further comprises a second logic or passive semiconductor die encapsulated in the second isolation layer or an isolation layer above the second structured metallization layer, the second logic or passive semiconductor die being electrically connected to the second power semiconductor die by at least the first structured metallization layer and the first plurality of electrically conductive vias or to another semiconductor die disposed within the integrated power module.

7. The integrated power module of claim 6, wherein:
the first power semiconductor die is a high-side power transistor die of a half-bridge or full-bridge circuit included in the integrated power module;
the second power semiconductor die is a low-side power transistor die of the half-bridge or full-bridge circuit;
the first logic or passive semiconductor die is a high-side passive component of the half-bridge or full-bridge circuit, the high-side passive component being electrically connected to the high-side power transistor die and encapsulated in the second isolation layer or an isolation layer above the second isolation layer; and
the second logic or passive semiconductor die is a low-side passive component of the half-bridge or full-bridge circuit, the low-side passive component being electrically connected to the low-side power transistor die.

8. The integrated power module of claim 7, wherein the low-side passive component is disposed on an uppermost isolation layer of the integrated power module.

9. The integrated power module of claim 7, wherein the low-side passive component is disposed in an isolation layer between the uppermost isolation layer and the isolation layer in which the high-side passive component is disposed.

10. The integrated power module of claim 1, wherein each of the isolation layers above the first structured metallization layer is a laminate.

11. The integrated power module of claim 1, wherein the insulating substrate of the power semiconductor module is part of a direct copper bonded substrate, a direct aluminum bonded substrate, or an active metal brazing substrate.

12. The integrated power module of claim 1, wherein each of the isolation layers comprises one or more of a polymer material, a mold material, a resin material, an epoxy resin material, an acrylate material, polyimide material, and a silicone-based material.

13. The integrated power module of claim 1, wherein the insulating substrate further comprises an additional metallized side opposite the metallized side to which the first power semiconductor is attached, wherein the additional metallized side is uncovered by isolation layer material.

* * * * *

UNITED STATES PATENT AND TRADEMARK OFFICE
CERTIFICATE OF CORRECTION

Page 1 of 1

PATENT NO.         : 10,211,158 B2
APPLICATION NO.    : 14/529371
DATED              : February 19, 2019
INVENTOR(S)        : O. Hohlfeld et al.

It is certified that error appears in the above-identified patent and that said Letters Patent is hereby corrected as shown below:

On the Title Page

(57) Abstract, Line 7, please change "attached the" to -- attached to the --

(57) Abstract, Line 8, please change "attached the" to -- attached to the --

Signed and Sealed this
Fourth Day of June, 2019

Andrei Iancu
*Director of the United States Patent and Trademark Office*